(12) United States Patent
Nippes

(10) Patent No.: US 6,460,013 B1
(45) Date of Patent: Oct. 1, 2002

(54) SHAFT VOLTAGE CURRENT MONITORING SYSTEM FOR EARLY WARNING AND PROBLEM DETECTION

(76) Inventor: Paul I. Nippes, 1 Tall Tree Rd., Middletown, NJ (US) 07748

( * ) Notice: Subject to any disclaimer, the term of this patent is extended or adjusted under 35 U.S.C. 154(b) by 0 days.

(21) Appl. No.: 09/563,819

(22) Filed: May 3, 2000

Related U.S. Application Data

(60) Provisional application No. 60/132,782, filed on May 6, 1999, and provisional application No. 60/133,762, filed on May 12, 1999.

(51) Int. Cl.[7] .............................................. G06F 11/30
(52) U.S. Cl. ......................................... 702/183; 702/58
(58) Field of Search ................................ 340/515, 510, 340/647, 521; 361/23, 31; 324/510, 545; 318/800; 702/183, 58

(56) References Cited

U.S. PATENT DOCUMENTS

| | | | |
|---|---|---|---|
| 3,831,160 A | * 8/1974 | Cronin et al. ................. | 340/515 |
| 4,378,138 A | 3/1983 | Sohre ........................... | 339/5 R |
| 5,032,826 A | * 7/1991 | Miller et al. .................. | 340/647 |
| 5,134,378 A | 7/1992 | Twerdochlib ................. | 324/545 |
| 5,355,040 A | 10/1994 | New ............................ | 310/90.5 |
| 5,488,281 A | 1/1996 | Unsworth et al. ............ | 318/806 |
| 5,521,482 A | * 5/1996 | Lang et al. ................... | 318/800 |
| 5,574,387 A | 11/1996 | Petsche et al. ............... | 324/772 |
| 5,675,497 A | 10/1997 | Petsche et al. ............... | 364/485 |
| 5,680,025 A | 10/1997 | Bowers, III et al. .......... | 318/806 |
| 5,715,609 A | 2/1998 | Nower ........................ | 33/645 |
| 5,726,911 A | 3/1998 | Canada et al. ............... | 364/550 |
| 5,739,698 A | 4/1998 | Bowes et al. ................ | 374/772 |

OTHER PUBLICATIONS

Principles of Magnetism and Stray Currents in Rotating Machinery, Paul I. Nippes, Jun. 22, 1998 (http://www-.gaussbusters.com/ppm93.html).
Motormonitor—Eleco Dowding & Mills, Jun. 26, 1998 (http://www.eleco.co.uk/motmon/motmmain.htm).
Motor Monitor Product Profile—Peak Energy/ECNZ, Jun. 26, 1998 (http://www.peak.co.nz/nmprof.html).
Electronic Motor Monitor Tells All—Ideas & Applications, Jun. 26, 1998 (http://www.penton.com/hp/idapp/idapp2.html).

* cited by examiner

Primary Examiner—John S. Hilten
Assistant Examiner—Xiuquin Sun
(74) Attorney, Agent, or Firm—David P. Krivoshik; Mathews Collins Shepherd & McKay

(57) ABSTRACT

A rotating machinery monitor provides a warning that is indicative of a developing problem with the rotating machinery. The rotating machinery monitor has at least one current sensor for detecting shaft grounding current in the rotating machinery, at least one voltage sensor for detecting shaft voltage in the rotating machinery, a change detector for determining rate of change in the shaft grounding current and a rate of change in the shaft voltage, and an evaluation system for producing a warning as a function of the change in the shaft grounding current, the rate of change in the shaft voltage, the shaft grounding current and the shaft voltage.

16 Claims, 6 Drawing Sheets

SHAFT VOLTAGE CURRENT MONITORING SYSTEM FOR EARLY WARNING AND PROBLEM DETECTION

RELATED APPLICATIONS

This application claims the benefit of U.S. provisional patent application serial No. 60/132,782 filed May 6, 1999 and the benefit of U.S. provisional patent application serial No. 60/133,762 filed May 12, 1999.

FIELD OF THE INVENTION

This invention relates to rotating machinery and more particularly to a shaft sensor for monitoring rotating machinery.

BACKGROUND OF THE INVENTION

Monitoring and maintenance methods for rotating machinery, such as generators, motors and turbo-machinery, currently lack sufficiently reliable for accurately indicating certain important problems, such as cracking of power transmission components or their structural support members, inadequacy of local lubrication, excessive wear, shorted insulation, stator winding faults, and various other failures. Rotating machinery faults and failures lead to unnecessary expenses, which could be avoided by timely repair or scheduled maintenance. The occasional catastrophic failure of rotating machinery can result in costly repairs and system down-time, having a rippling effect on businesses dependent on the plant machinery or the power generated by the plant machinery. Downtime caused by a failure of rotating machinery reduces productivity and profitability.

Therefore, there is a need to monitor rotating machinery to reliably predict development of a failure as well as to determine when the rotating machinery operation is normal.

SUMMARY OF THE INVENTION

The present invention is a rotating machinery monitor, which provides a warning that is indicative of a developing problem with the rotating machinery. The rotating machinery monitor has at least one current sensor for detecting shaft grounding current in the rotating machinery, at least one voltage sensor for detecting shaft voltage in the rotating machinery, a change detector for determining rate of change in the shaft grounding current and a rate of change in the shaft voltage, and an evaluation system for producing a warning as a function of the change in the shaft grounding current, the rate of change in the shaft voltage, the shaft grounding current and the shaft voltage. A method for practicing the present invention is also described.

DESCRIPTION OF THE DRAWINGS

The present invention is described in detail below in conjunction with the drawings, of which.

DETAILED DESCRIPTION

Figure 1:
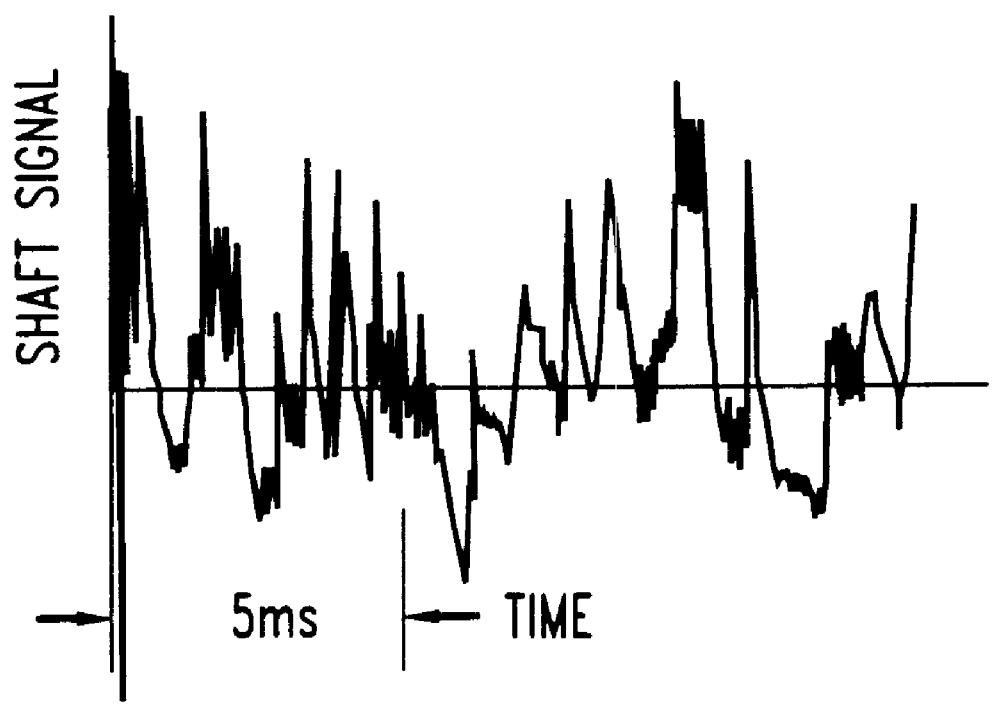
FIG. 1 shows a typical wave form produced from the signals of the shaft-riding brushes.

In rotating machinery a shaft imbalance, winding deficiency, seal failure, bearing failure and other similar failures result in changes to a normal shaft voltage/current, which can be sensed using a pick-up on the rotating shaft. The present invention, shaft voltage current monitoring system for early warning and problem detection, is a monitoring system which tracks shaft voltages and currents, providing advance notification of most unit problems. The monitoring system employs a shaft voltage/current monitor (the VCM) which gives readings of shaft current and shaft voltage, and provides an indication of the start of a problem in rotating machinery. However, the shaft voltage/current signals require a specially trained observer and an intimate knowledge of system failure profiles to make sense out of the raw signals.

Trending of shaft voltage/current over time indicates development of specific irregularities when they first occur, long before standard instruments and monitors respond to the abnormality. Traditional instruments and monitors indicate and/or alarm only after an abnormality has existed for sufficient time to generate enough heat, vibration, noise or contamination to be indicated or to set off an alarm, by which time, damage has already occurred. An advance warning is provided by the VCM system, either indicating a definite problem requiring action, or alerting operators that they should note trends of conventional instruments and monitors for potential development of a problem. Corrective measures, can then be implemented as the situation dictates, typically before damage occurs. Further, a prediction can be made as to the future of shaft voltage and current monitoring in rotating machinery, thus enabling the VCM system to act as a precursor and confirming factor in unit operation and maintenance.

The VCM system, using the shaft as a sensor provides shaft signals, which alert the operators and engineers to take either definite action or to exercise precautions, Such precautions can include the monitoring and trending of conventional sensors and instruments in order to identify and possibly confirm an indicated condition.

One representative embodiment of the VCM system utilizes surface mount technology in the design of the circuit board, thus providing a relatively small, yet highly functional system which can be integrated into the machine/motor. As the VCM system is typically mounted near the machine, it is considered a "smart field sensor." The VCM system input consists of current and voltage signals from insulated shaft riding brushes employed to ground the shaft and sense shaft voltages. While the VCM system can be fed from any type of insulated shaft riding brush, a high quality brush is preferable because of its very reliable performance. Two different shaft-riding brushes include the reliable bristle type and a copper strap used as a brush. With frequent maintenance, the strap has fairly good reliability, but it tends to fail if not cleaned often. The bristle brush picks up a real-time signal, depicting either current or voltage.

The VCM system utilizes real-time input of raw shaft quantities, grounding currents and shaft voltages. The signals are conditioned and converted for transmission to the signal processing and analysis system. The signals can equally well be converted into other standard forms for serial and parallel digital interfaces. The particular types of interfaces as well as conversion between the forms of signals are well known to those skilled in the art.

The shaft voltage and current input signals are processed such that the raw information is condensed by the VCM system, producing manageable data volume. A typical waveform, produced from the signals of the shaft-riding brushes is shown in FIG. 1 with the shaft signal plotted over time. This raw shaft signal is fed to a signal processing and analysis system. A normalized and condensed signal, representative of the original wave, is available for signal evaluation and unit condition determination, either by a computer-based system, specialized digital circuit, analog circuit or hybrid system.

Figure 2A:
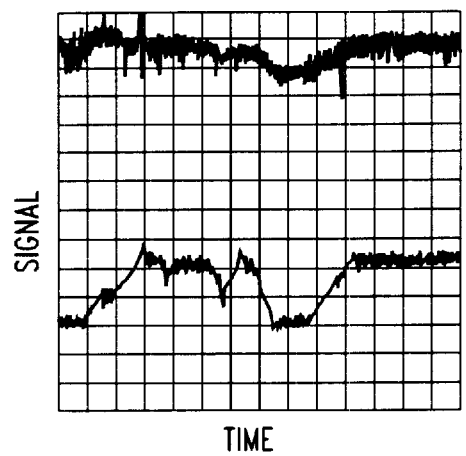
FIGS. 2a, 2b and 2c show traces of the shaft voltage/current signals for analysis and/or recording.
Figure 2B:
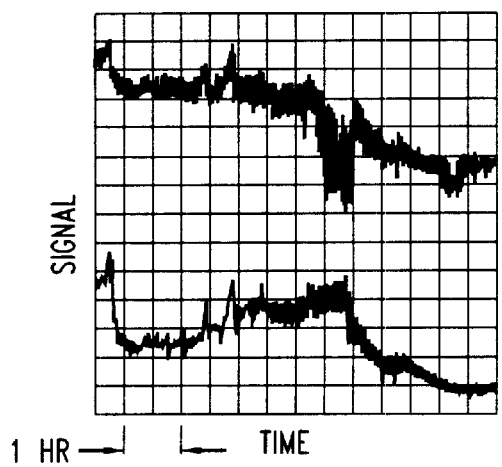
Figure 2C:
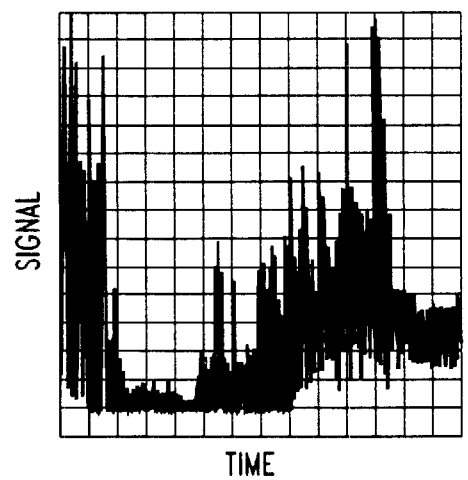

Referring to FIGS. 2a, 2b and 2c there are shown traces of the VCM signals which are supplied for analysis. Note that in one embodiment, a representative 5 ms interval on the real-time trace is comparable to one hour on the VCM output traces, constituting a reduction in data by 720,000 times. Other levels of data reduction are equally well suited, dependent upon the devices interfaced and how the analysis is performed.

FIG. 2a shows variations in the shaft voltage and grounding current, indicating the unit is "OK." FIG. 2b shows correspondence of the other traces, except for one period where the voltage drops and the current increases slightly, arousing suspicion of possible problem development. FIG. 2c shows wild deflections, a significant deviation from the straight-line low-level characteristics it had for days before and after this period. The cause for this behavior is still not known; however, it is indicative of a developing problem. Problems producing this type of characteristic include stator core lamination packet shorting, rotor field winding turn shorting, or stator coil transposition shorting. All of these problems will appear stable after the faulting components melt together, thereby stressing the importance of continuous monitoring so as not to miss an event. None of this damage is shown on conventional instrumentation during early stages of its development.

Since the shaft grounding current and voltage are very sensitive to changes in the machinery, a developing problem can be detected long before there is damage and long before these are indicated by conventional monitors and/or unit instrumentation. An example of this is the occurrence of a shaft rub. The instant a metal-to-metal rub exists, the VCM system will detect an increase in the shaft grounding current and a decrease in the shaft voltage, while vibration and temperature sensors will not show indications of an abnormality until after the rub has existed long enough for damage to occur which produces excessive heat and vibration. It, should be noted that the VCM system warnings can be used in combination with temperature, vibration and other instruments.

Interpretation of the VCM output signals is highly dependent on the location of the train grounding brushes and voltage sensing brushes. On larger trains, such as turbine generators, dual VCM's are used, one for each brush or group of brushes. Multiple brushes and VCM's carry higher grounding currents and provide redundancy, which is useful for ensuring continuous shaft grounding during brush maintenance.

Figure 3:
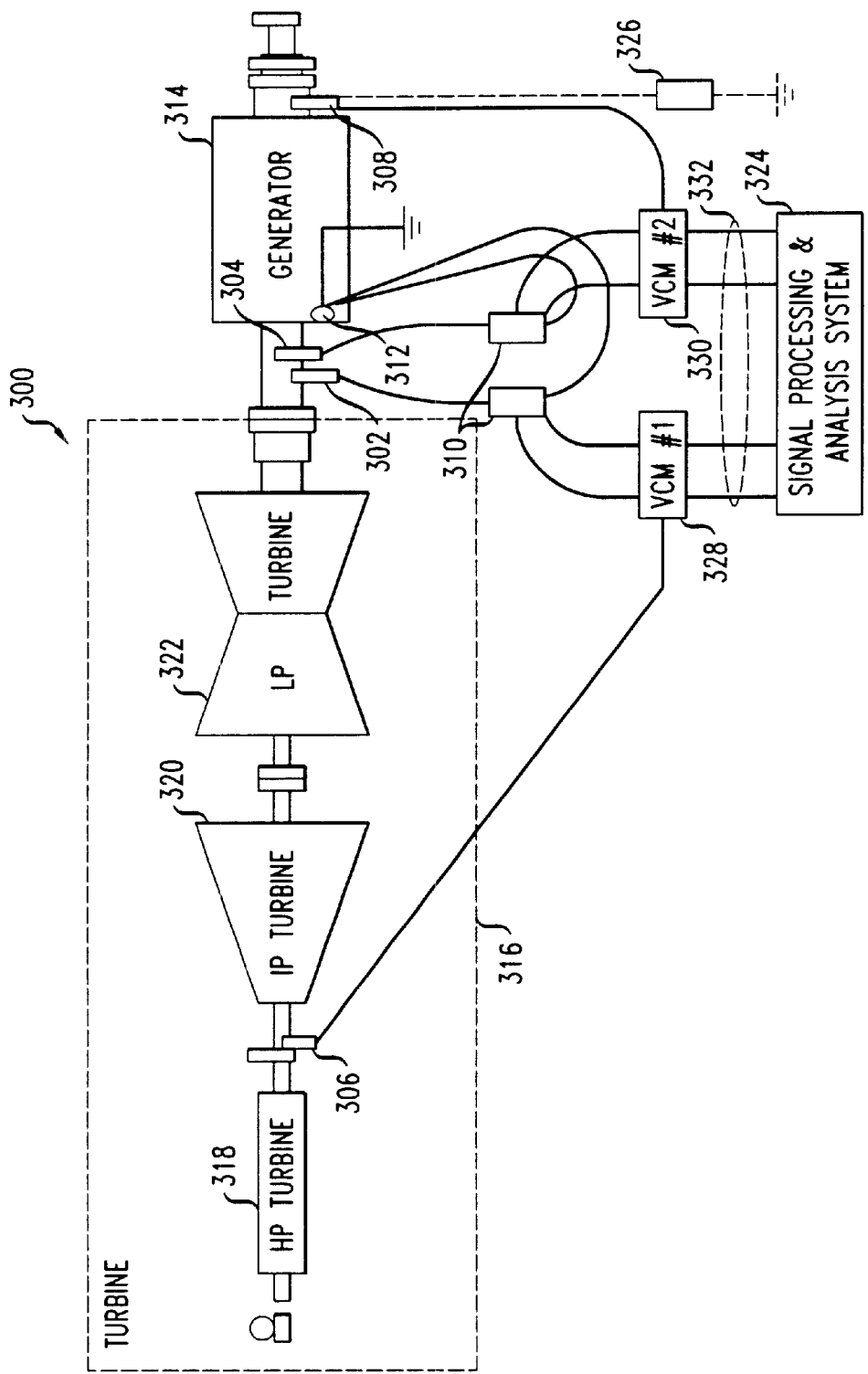
FIG. 3 is an exemplary schematic representation of the present invention VCM in use with a large turbine generator.

FIG. 3 shows one example of applying first grounding brush 302, second grounding brushes 304, first shaft voltage sensing brush 306 and second shaft voltage sensing brush 308 to a large turbine generator 300. The large turbine generator 300 is essentially a turbine 316 coupled to a generator 314. The turbine 316 is typically comprised of a HP turbine 318, which is coupled to an IP turbine 320, which is coupled to an LP turbine 322. Note that the grounding brush cables connect to current shunts or tapped resistors 310 if current limiting is desired. From here, the grounding cables connect to the nearby lower bearing housing 312, shown at the generator 314. The turbine bearing may alternatively be selected where there is voltage between the generator frame and ground. In any case, the lower bearing housing, along with the generator frame and turbine casings should be bonded to the station ground grid. A first shaft voltage/current monitor (VCM) 328 and a second shaft voltage/current monitor (VCM) 330 are coupled to first and second grounding brushes 302 and 304, first and second shaft voltage sensing brushes 306 and 308, and current shunt or tapped resistors 310. The first VCM 328 and the second VCM 330 provide data signals and alarm signals 332 which are coupled to a signal processing analysis system 324. A change detector determines the rate of change (first order derivative) of the shaft grounding current and the rate of change (first order derivative) of the shaft voltage. The signal processing analysis system 324 can be a dedicated circuit, digital logic circuitry, a programmable circuit, a time shared or time sliced device, a digital processor, a microprocessor, as well as similar devices. This circuitry can be made up of solid-state comparators, displays, converters, transmitters and conditioners, providing notification of possible developing problems. A voltage spike and transient absorber 326 can be optionally coupled to the second shaft voltage sensing brush 308 as needed.

Additional shaft grounding may be needed at the collector ring, or exciter end of the generator, due to possible high-frequency voltages imposed by solid state circuits, as in exciters. These high frequencies are known to damage bearings even when they are insulated, because the insulation acts as a capacitor, passing high frequency currents through the insulation. This current is easily shunted to ground through a tuned filter 316 attached to the second voltage sensing brush 308. An additional and important role of the second sensing brush 308 is to detect loss of insulation integrity at the outboard bearing, hydrogen seal, or coupling.

The first sensing brush 306, located at the turbine 316, detects an increase in static charge in the turbine 316. Both the first sensing brush 306 and the second sensing brush 308 signal first development of rubs as a sudden drop in voltage, usually to ½ the prior value. Additional indications include: a high voltage at the first sensing brush 306, inversely proportional to steam temperature indicates wet steam in the turbine 316; high current in the grounding brushes 302 and 304 and low voltage at the second sensing brush 308 indicates loss of bearing or seal insulation; rapid escalation in both the voltage of the second sensing brush 308 and grounding currents indicates a developing stator winding fault; erratic and pulsing voltage and current indicates stator lamination shorting and melting; long term gradual increases in voltage and current indicate a shift in the air gap; pulsing followed by a gradual increase in shaft voltage and current indicates rotor winding faulting; shaft voltage changes related to excitation changes may indicate the need for a shaft voltage harmonic filter; low brush current indicating brush or grounding maintenance required.

Figure 4:
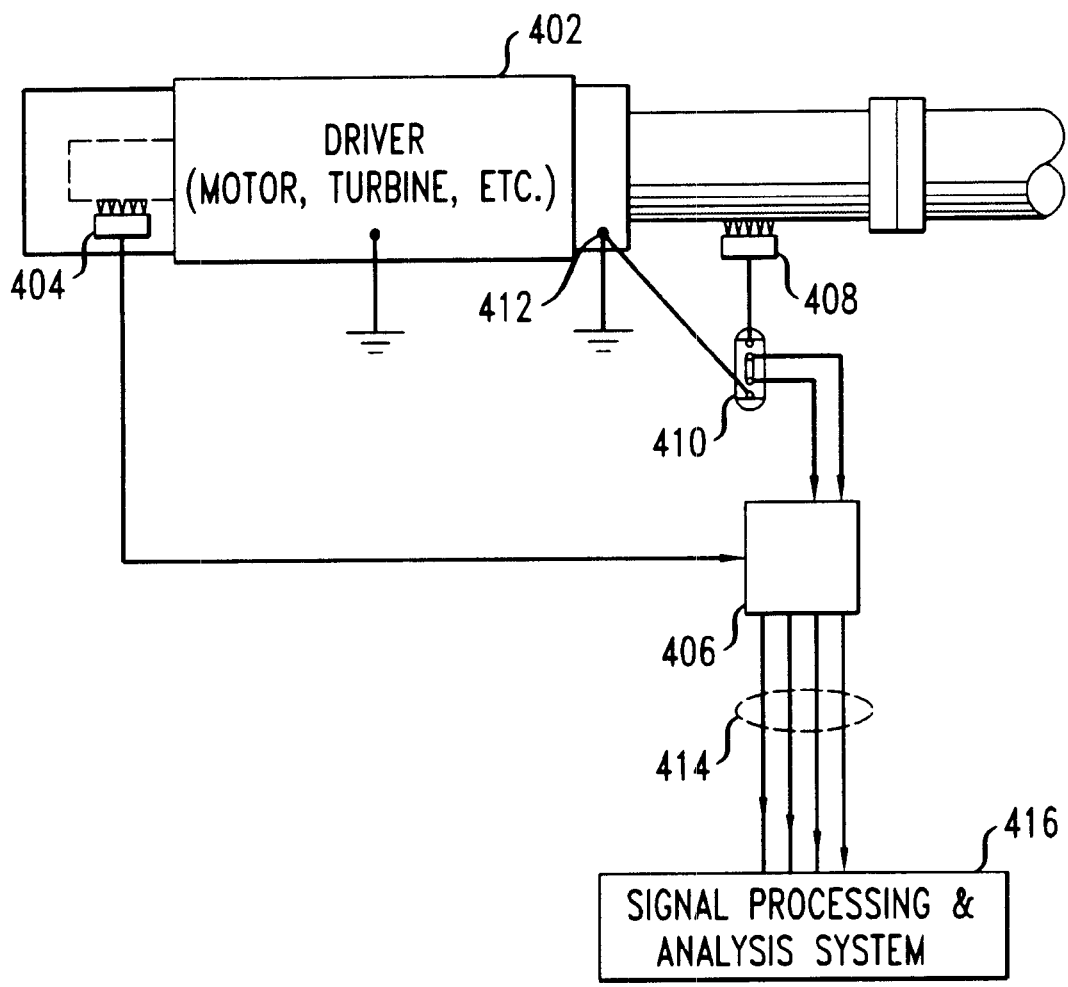
FIG. 4 is an exemplary schematic representation of the present invention VCM in use with industrial-class machinery.

Referring to FIG. 4, there is shown an exemplary embodiment of the application of a shaft voltage/current monitor (VCM) system to industrial-class machinery 402, such as boiler feed pumps, fans and turbo-compressor trains. Sensing brush 404 is coupled between the shaft at the outboard end of the machinery 402 and the VCM 406. A grounding brush 408 is coupled to the shaft at the inboard end of the machinery 402. The grounding brush 408 is coupled to the VCM 406 through a current shunt 410 and is coupled directly to the VCM 406. The current shunt 410 is coupled to the bearing housing 412. The VCM 406 provides data signals and alarm signals 414, which are coupled to a signal processing analysis system 416.

Figure 5:
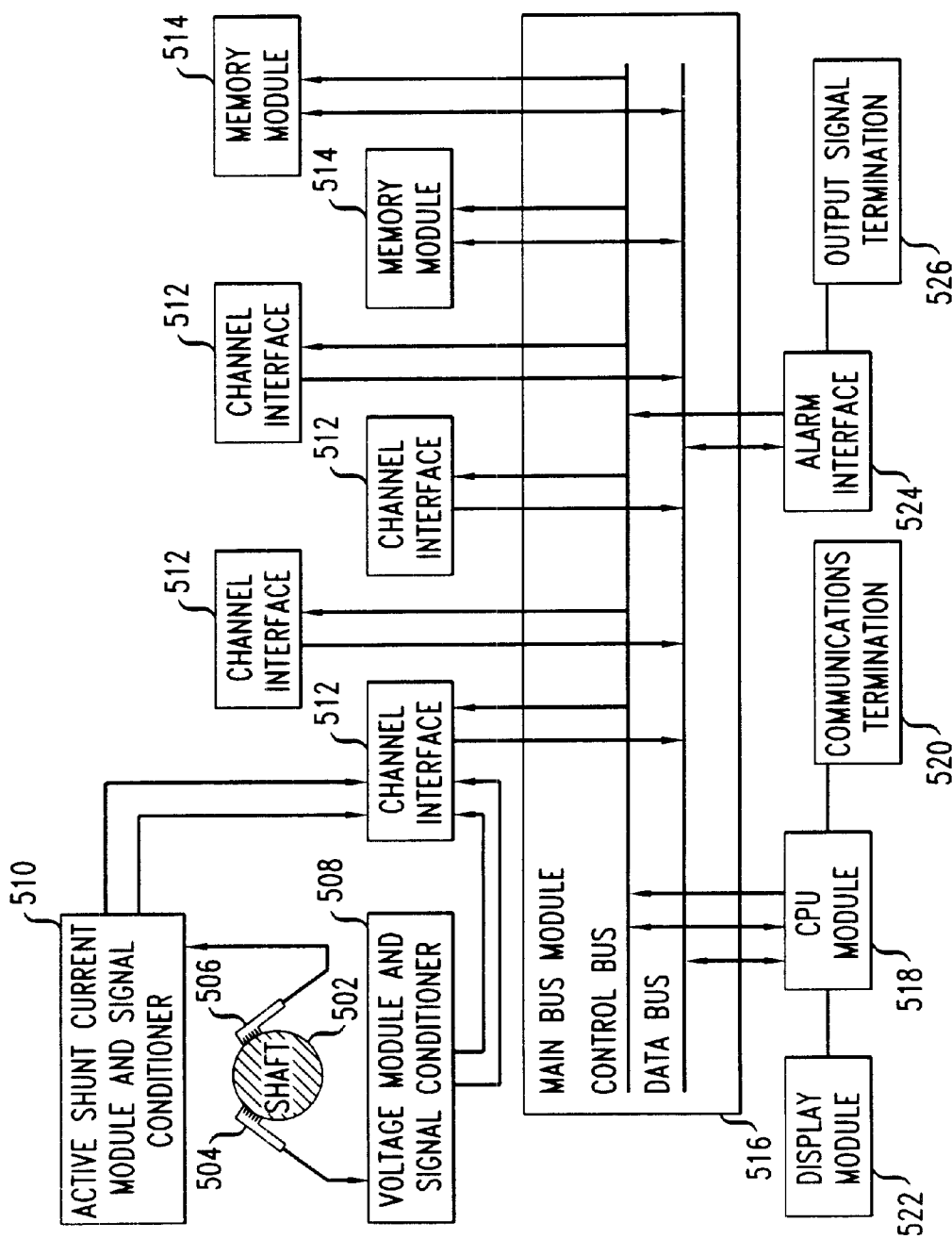
FIG. 5 shows a schematic block diagram of a representative embodiment of the present invention.
Figure 6:
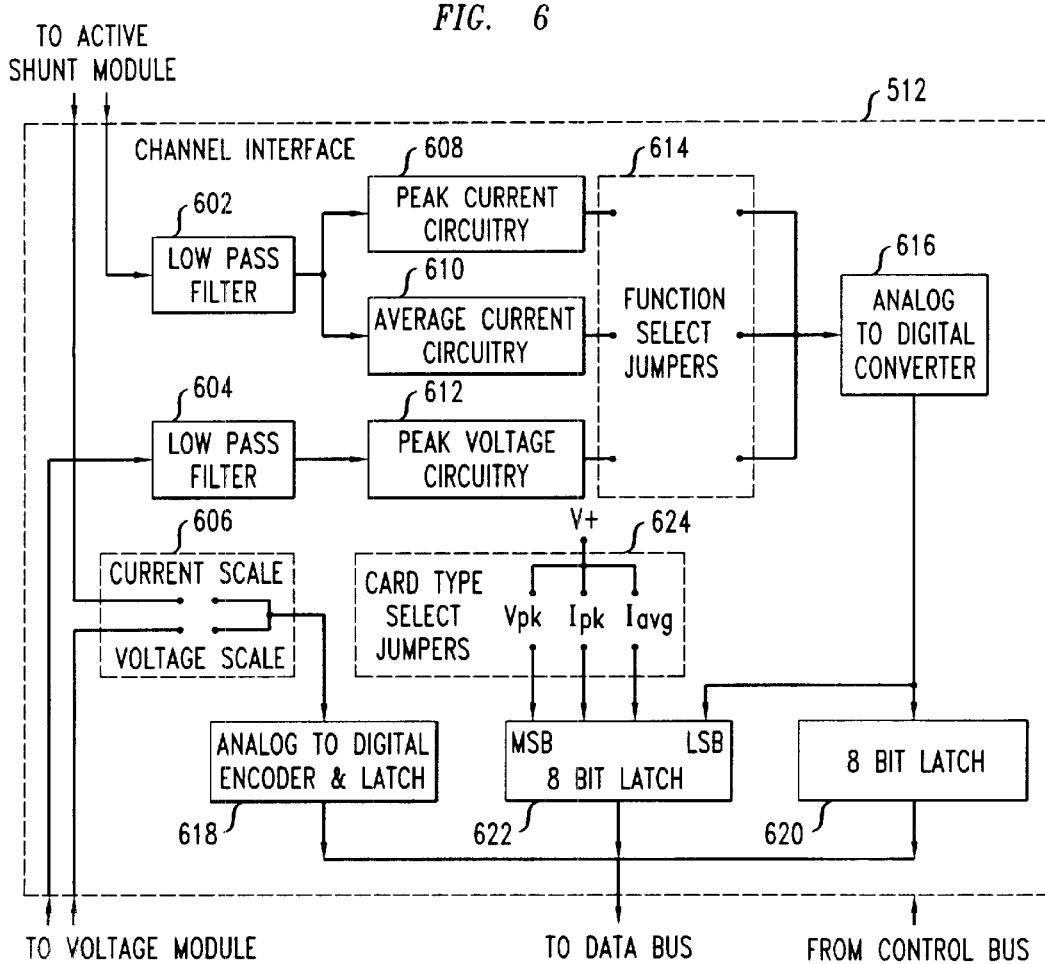
FIG. 6 shows a more detailed schematic block diagram of the channel interface; and, FIG. 7 shows a more detailed schematic block diagram of a CPU module.
Figure 7:
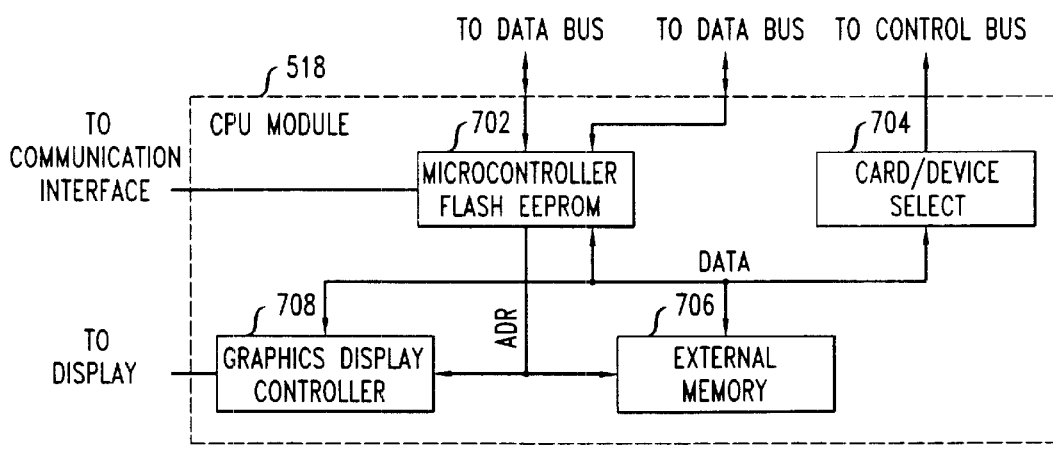

Referring to FIG. 5 in conjunction with FIGS. 6 and 7 there is shown a block diagram of one embodiment of the present invention. Although the present invention is well suited for implementation by board level integration, it is equally well suited for higher integration, including hybrid analog/digital boards, application specific integrated circuits (ASIC) and hybrid analog/digital integrated circuits. The higher level of integration provides the ability to increase reliability of motors in mission critical applications such as medical devices, aerospace industry and continuous process machinery.

In one embodiment, the motor can be designed as a replacement for existing motors, wherein an integral monitoring and alarm/warning are transparent to normal unit operation and further, the motor replacement with integral monitoring can be installed as a direct replacement for an existing motor. In another embodiment, where the motor replacement with integral monitoring is installed in equipment having digital communication capabilities, the reduced data and/or the alarm/warning information may be integrated through the digital communications.

Again referring to FIG. 5 there is shown a shaft 502 in cross section having shaft sensors 504 and 506. Shaft sensor 504 is coupled to voltage module and signal conditioner 508. Shaft sensor 506 is coupled to active shunt current module and signal conditioner 510. Channel interface 512 is typically one of four, which are utilized in this embodiment. The channel interface 512 may be a plug in module/board, or integrated as an ASIC. A first and second output of the active shunt current module and signal conditioner 510 are coupled to the channel interface 512. A first and second output of the voltage module and signal conditioner 508 are coupled to the channel interface 512.

The outputs of the channel interface 512 are coupled to a main bus module 516. A control bus of the main bus module 516 is coupled to each channel interface 512, memory modules 514 and alarm interface 524. A data bus of the main bus module 516 is coupled to each channel interface 512, memory modules 514 and alarm interface 524. The alarm interface 524 is coupled to an output signal termination block 526 by a 4–20 mA or other suitable interface.

A CPU module 518 is coupled to the control bus and the data bus of the main bus module 516. The CPU module 518 also coupled to a communications interface 520 and a display module 522. The CPU module 518 with suitable program memory contains the diagnostic algorithm.

Again referring to FIG. 6 there is shown shows a more detailed schematic block diagram of the channel interface 512. A first output of the active shunt current module and signal conditioner 510 is coupled to first low pass filter 602. A first output of the voltage module and signal conditioner 508 is coupled to second low pass filter 604. A second output of the active shunt current module and signal conditioner 510 and a second output of the voltage module and signal conditioner 508 are coupled to current/voltage selection jumpers 606. The output of the first low pass filter 602 is coupled to peak current circuitry 608 and average current circuitry 610. The output of second low pass filter 604 is coupled to peak voltage circuitry 612. The outputs of peak current circuitry 608, average current circuitry 610 and peak voltage circuitry 612 are coupled to function selection jumpers 614. The output of the function selection jumpers 614 is coupled to an analog to digital converter 616. The output of the analog to digital converter 616 is coupled to a first eight-bit latch 620 and to the least significant bits of a second eight-bit latch 622. Card type select jumpers 624 are coupled to V+ and the most significant bits of the second eight-bit latch 622. The output of the current/voltage selection jumpers 606 is coupled to analog to digital encoder and latch 618. The current/voltage selection jumpers 606, the function selection jumpers 614 and the card type select jumpers 624 can be implemented with any number of suitable methods or devices including switches and with circuitry and the description should not be considered limiting. The outputs of the first eight bit latch 620, the second eight bit latch 622, and the analog to digital encoder and latch 618 are coupled to a data bus of main bus module 516.

Again referring to FIG. 7 there is shown shows a more detailed schematic block diagram of the CPU module 518. The CPU module 518 is coupled to the main bus module 516. The CPU module 518 contains a card/device select 704, which is coupled to the control bus of the main bus module 516. The control bus and the data bus of the main bus module 516 are coupled to a digital microcontroller with suitable program memory (such as a flash EEPROM) 702, which is coupled to a serial communications interface 520, graphics display controller 708, and external memory 706. The external memory 706 and the graphics display controller 708 are coupled through a data bus to the card/device select 704. The graphics display controller 708 is coupled to a suitable display module 522 such as a LCD graphics display module. The digital microcontroller 702 with suitable program memory contains the diagnostic algorithms.

The detailed design, of the many implementations of the functional circuit elements described herein, are well known to those skilled in the art. Many other embodiments of the functional elements are equally well suited. While the present invention VCM system is ideally suited for use in a digital environment and has been so described, the fundamental concepts are applicable to an analog environment as well. The actual signals being monitored may be digitized at a number of stages, or may remain in analog form and be compared to predetermined levels for detection and prediction of problems.

Indications of problems includes: voltage decrease to half or less and current significant increases indicates shaft rub; and current and voltage increases by two times indicates static charge from steam, oil or product flow. Where the monitored equipment is an electrical machine, indications of problems includes: current increase and voltage decrease indicates loss of bearing, seal or coupling insulation; voltage and current 60 Hz erratic increase indicates developing stator core/winding faulting; high voltage and current at 60 Hz indicates magnetic circuit asymmetry or air gap misalignment; and pulsing then gradually increasing 60 Hz voltage and current indicates rotor winding faulting. Additional brushes and VCM's may be required on some trains because they include electrically active items, such as motors and generators. This is also the case where there are electrically separate shafts needing protection, such as on the opposite side of gears and couplings, if insulated or gear-type. The need should be determined by the designer and the user, and should be based on the particular characteristics of the machinery.

With predictive information being available from the VCM system, one way to improve performance and on-line operating time is to programmatically set up algorithms to automatically recognize and diagnose possible development of a problem. The algorithms can be based upon the conditions described below in Tables 1, 2, 3 and 4. Shaft voltage and grounding current monitoring by the VCM system is analyzed to determine unit condition and provide predictive capabilities. Some representative examples of this analysis follows.

Shorted insulation or lack of insulation on electrical machinery outboard bearings and, where applicable, couplings is indicated by low voltage on the voltage sensing brush at the motor outboard end, accompanied by very high current in the inboard end grounding brush.

Shaft rubs are indicated, during testing, when a motor exhibited a drop in shaft voltage to ½ its previous value. It should also be noted that an oscilloscope trace of this voltage had the appearance of a half-wave rectifier, rather than the prior full wave trace. Disassembly of the motor revealed that a rub had developed. When cleared, the full wave character of the shaft voltage was restored.

Electrostatic charge generation was indicated for a 750 MW turbine generator which had a shaft grounding current of 3.0 peak amperes on the VCM and a steam inlet to the turbine temperature of 970° F. When this temperature was dropped to 950° F., the grounding current increased to 6.0 amperes. Thus indicating that wet steam, a known factor in electrostatic voltage generation, was the probable cause. When electrostatic shaft voltage generation is due to dry steam where it enters turbines with partial circumference entry ports or openings, voltages in the hundreds of volts have been measured.

Harmonics and voltage spikes, in the shaft, are found to reach hundreds of volts unless reduced by shaft grounding or reliable harmonic suppresser circuits in the excitation supply.

The VCM circuitry alarming on current below the minimum setting indicates loss of shaft grounding.

High, and possibly increasing, residual magnetism may be the cause of high and/or increasing shaft voltage and grounding currents, a condition requiring degaussing as dictated by the seriousness of the voltage condition or damage to bearings.

Electrical machinery defects include stator winding faults, core lamination shorting, broken rotor bars in induction machines, shorted turns in synchronous machinery fields, stator gap or segment misalignment, and power system-induced unbalances or harmonics. All produce asymmetries in the magnetic or electric circuits, resulting in increases or changes in the shaft voltage and grounding currents.

The current shunts in the shaft grounding brush cable and voltage sensing brushes provide raw signals to the VCM system for processing. By processing and conditioning the sensed signals they are analyzed and evaluated to provide warning of developing problems with the rotating machinery. Table 1 presents the warning criteria for electrical electrically isolated rotating machinery shafts. Table 2 presents the warning criteria for induction motors and induction generators. Table 3 presents the warning criteria for synchronous motors and synchronous generators. Table 4 presents the warning criteria for direct current motors and direct current generators. The particular warning criteria is indicative of the developing problems, which are identified at the top of each corresponding column. Appended to the end of each table is information which can be obtained from some types of conventional instruments and monitors for trending and either confirming, or not confirming, the indicated problem development. Optionally, the information from the conventional instrument and monitor trending can be incorporated into the signal processing and analysis, enhancing the value of the warning. Table 5 contains a summary of legends and notes, which are useful in understanding Tables 1, 2, 3 and 4.

TABLE 1

| ITEM | 1<br>Shaft<br>Grounding<br>Maintenance | 2<br>High Electrostatic<br>Charge on Shaft | 3<br>High Residual<br>Magnetism | 4<br>High Localized<br>Internal Residual<br>Magnetism | 5<br>Shaft element<br>Contact to<br>Stationary element<br>(Bearing, Seal) |
|---|---|---|---|---|---|
| Ipk | <<Ipkmn | >Ipkmx | >Ipkmx | <Ipkmn | >>Ipkmx↑it |
| Iav | <<Iavmn | | | <Iavmn | >>Iavmx↑it |
| f | er | er | nrf | | nrf |
| Vpk | ↑it | | <Vpkmx | <Vpkmn | ↓it |
| Ipk/Iav | | >2. | <2. | | <2. |
| EM/f | | ?/er | ↑/nrf | ↑/nrf | ↑/rf |
| | Based upon changes in value and with time of machine or train conventional instruments | | | | |
| Brg. Vibr. | | ↑ot | ↑ot | ↑ot | ↑st |
| Brg. Temp. | | ↑ot | ↑ot | ↑ot | ↑st |
| Oil Particles | | | ↑ot | ↑ot | |
| Audible | | ↑ot | ↑ot | ↑ot | ↑st |
| Shaft displacement | | ↑ot | ↑ot | ↑ot | |
| CONFIRM #2;<br>Ipk = 0 | VCM voltage readings with shaft grounding disconnected. Current flow in brgs, etc.? | | | | |
| Vpk | <Vpkmn | >>Vpkmx | >Vpkmx | <Vpkmn | >Vpkmx |
| Vav | <Vavmn | <Vavmx | >Vavmx | <Vavmn | >Vavmx |
| Vf | | er | nrf | | nrf |
| Vpk/Av | | >2. | | | |
| Visual & Test | Inspect and | Frosting on | Heaving frosting, | Dismantle and | Rub t of rotating |

TABLE 1-continued

|  | ohmeter test brush, cables & grounding circuit | Bearings, seals | spark tracks at bearings. Shaft drops and/or moves axially | make magnetic survey of internal components | | to stationary parts. Thermal distortion, discoloration |
|---|---|---|---|---|---|---|
| Causes | a. There is no stray voltage source. b. Brush contact to the shaft is lost. c. Brush grounding circuit is open. | a. Wet Stream. b. Dry steam. c. High oil velocity. d. Oil filter. | a. Magnetized components, rotor or stator. b. Improper welding practices. c. Electric currents. d. Magnetic Particle inspection. e. Lightning. | a. Magnetism inside unit, not measurable either as magnetism or generated voltage external to the unit. b. Usually a rub, installed magnetized part, welding, MPI etc. | | a. Looseness, movement. b. Imbalance. c. Foreign objects. d. Mechanical distortion. |

TABLE 2

| ITEM | A Shorted insulation on bearing, seal or coupling. | B Shorted stator or rotor core laminations. | C Armature winding turn or transportation fault. | D Low level armature winding fault to ground. | E Electrical system has phase unbalance or harmonics. | F Uneven Air gap or stator segment misalignment | G Induction motor bar or end ring breakage or discontinuity. |
|---|---|---|---|---|---|---|---|
| Ipk | >>Ipkmx↑st | >Ipkmxer | >Ipkmx↑ot | >Ipkmx↑ot | >Ipkmx | >Ipkmx | >Ipkmx |
| Iav | >>Iavmx↑st | >Iavmxer | >Iavmx↑ot | >Iavmx↑ot | >Iavmx | >Iavmx | >Iavmx |
| f | ef | nef | nef | ef + 3h | nef | nrf | nrf |
| Vpk | <Vpkmnit | >Vpkmxster | >Vpkmx | >Vpkmx | >Vpkmx | >Vpkmx | >Vpkmx |
| Ipk/Iav | <2. | <2. | <2. | <2. | <2. | | |
| CONFIRM 1 | Based upon changes in value and with time of machine or train conventional instruments | | | | | | |
| Brg. Vibr. | ↑st | | | | | ↑ot | ↑st |
| Brg. Temp. | ↑st | | | | | | |
| Arm. Temp. | | ↑ot | ↑st | | | | |
| Oil Particles | ↑st | | | | | | |
| Audible | | ↑ot | | | ↑ot | | ↑ot |
| Core Vibr. | | ↑ot | | | ↑ot | ↑ot | |
| Harm Iph | | ↑iter | ↑ot | ↑ot | ↑ot | | ↑ot + sbf |
| Harm Vph | | | ↑ot | | | | |
| Par. Disch. | ↑it | ↑it | ↑ot | | | | |
| Gas Monitor | ↑ster | ↑ot | ↑ot | | | | |
| CONFIRM #2 | Based on VCM voltage readings when grounding brush(es) are disconnected momentarily | | | | | | |
| Vpk | >Vpkmn | >Vpkmxer | >Vpkmx | >Vpkmx | >Vpkmx | >Vpkmx | >Vpkmx |
| Vav | >Vavmn | >Vavmxer | >Vavmx | >Vlamx | >Vavmx | >Vavmx | >Vavmx |
| Vf | ef | nef | nef | ef + 3h | nef | nrf | nrf |
| Visual and Tests | Look for shorted insulation; measure insulation resistance with ohmmeter following procedure in IEEE #112 | **Inspect lamination edges with a 60× microscope. Perform core "loop test" and possibly el-cid test | **Inspect coils for signs of over heating. Measure phase, coil group resistances, progressively to isolate. | **Megger, high-pot test armature phases then coil groups and coils to isolate fault | Operating examination and fast fourier analysis on the power system voltages and line currents | **Look for possible weld cracks, core or segment shifts. Measure air gap fully around the bore, both ends. | **Confirm side band test results by careful rotor cage inspection, broken bar test and x-ray examinations. |
| Causes | Foreign object, bad design or assembly | Foreign object, loose, tight, or overheated core. | Short circuit between coil Adjacent turns or conductors. | Coil fault near neutral or start of a large fault to ground. | Unbalance or harmonics of the electrical power system | Misalign rotor in stator, broken welds, no dowels | Inertia, load too high for starting inertia or poor braze |

TABLE 3

| ITEM | A Shorted insulation on bearing, seal or coupling. | B Shorted stator core laminations. | C Armature winding turn or transposition fault. | D Low level armature winding fault to ground. | E Electrical system has phase unbalance or harmonics. |
|---|---|---|---|---|---|
| Ipk | >Ipkmx↑st | >Ipkmxer | >Ipkmx↑ot | >Ipkmx↑ot | >Ipkmx |
| Iav | >Iavmx↑st | >Iavmxer | >Iavmx↑ot | >Iavmx↑ot | >Iavmx |
| f | ef | nef | nef | ef + 3h | nef |
| Vpk | <Vpkmnit | >Vpkmxer | >Vpkmx | >Vpkmx | >Vpkmx |
| Ipk/Iav | <2 | er | <2 | <2 | |

TABLE 3-continued

| CONFIRM 1 | Based upon changes in value and with time of machine or train conventional instruments | | | | |
|---|---|---|---|---|---|
| Brg. Vibr. | ↑st | | | | |
| Brg. Temp. | ↑st | | | | |
| Arm. Temp. | | | ↑ot | ↑st | |
| Oil Particles | ↑st | | | | |
| Audible | | ↑ot | | | ↑ot |
| Core Vibr. | | ↑ot | | | ↑ot |
| Harm lph | | ↑iter | ↑ot | ↑ot | ↑ot |
| Harm Vph | | ↑ot | | | |
| Par. Disch. | | ↑it | ↑it | ↑ot | |
| Gas Monitor | | ↑ster | ↑ot | ↑ot | |
| Fld grnd fault | | | | | |

| CONFIRM #2 | VCM voltage readings with shaft grounding disconnected. Current flow in brgs, etc.? | | | | |
|---|---|---|---|---|---|
| Vpk | >Vpkmn | >Vpkmxer | >Vpkmx | >Vpkmx | >Vpkmx |
| Vav | >Vavmn | >Vavmxer | >Vavmx | >Vlamx | >Vavmx |
| Vf | ef | nef | nef | Nef + 3h | nef |
| Visual and Tests | Look for shorted insulation; measure insulation resistance with ohmmeter following procedure in IEEE #112 | **Inspect lamination edges with a 60x microscope. Perform core "loop test" and possibly el-cid test | **Inspect coils for signs of over heating. Measure phase, coil group resistances, progressively to isolate | **Megger, high-pot test armature phases then coil groups and coils to isolate fault | Operating examination and fast fourier analysis on the power system voltages and line currents |
| Causes | Foreign object, bad design or assembly | Foreign object; loose, light or overheated core. | Short circuit between coil Adjacent turns or conductors. | Coil fault near neutral or start of a large fault to ground. | Unbalance or harmonics of the electrical power system |

| ITEM | F Uneven Air gap or stator segment misalignment | H Short circuiting of field excitation winding turns | I Field excitation winding ground fault | J voltage or current transients from excitation current. |
|---|---|---|---|---|
| lpk | >lpkmx | >lpkmx↑er | >>lpkmxit | >>lpkmx |
| lav | >lavmx↑er | >lavmax↑er | >>lavmsit | <lavmn |
| f | nrf | nxrf | nef | nef |
| Vpk | >Vpkmx | >Vpkmx↑er | >>Vpkmxit | >Vpkmx |
| lpk/lav | | <2. | | >2. |

| CONFIRM 1 | Based upon changes in value and with time of machine or train conventional instruments | | | |
|---|---|---|---|---|
| Brg. Vibr. | ↑ot | ↑ot | | |
| Brg. Temp. | | | | |
| Arm. Temp. | | | | |
| Oil Particles | | | | |
| Audible | | | | |
| Core Vibr. | ↑ot | | | |
| Harm lph | | | | |
| Harm Vph | | | | |
| Par. Disch. | | | | |
| Gas Monitor | | | | |
| Fld grnd fault | | ↑it | | |

| CONFIRM #2 | VCM voltage readings with shaft grounding disconnected. Current flow in brgs, etc.? | | | |
|---|---|---|---|---|
| Vpk | >Vpkmx | >Vpkmx | >Vpkmx | >>Vpkmx |
| Vav | >Vavmx | >Vavmx | >Vavmx | <Vavmn |
| Vf | nrf | nrf | | 6xer |
| Visual and Tests | **Look for possible weld cracks, core or segment shifts. Measure air gap fully around the bore, both ends. | High field current at load. Low rotor winding AC impedance turn test **AC pole drop test. Dismantle rotor | *Low megger, Visual check collector, field leads. **To locate fault. May require removal and dismantle rotor | Oscilloscope trace of shaft voltage and current confirm excitation supply as the source. |
| Causes | Misalign rotor in stator, broken welds, no dowels | Rotor coil turn distortion due to centrifugal forces and thermal distortion | Weakness or breakdown of excitation winding, leads to ground | Excitation system transients with no suppression |

TABLE 4

| ITEM | A Shorted insulation on bearing, seal or coupling. | B Shorted armature core laminations. | C Armature winding turn fault. | D Low level armature winding fault to ground. | E-Commutator or brush problems causing circuit unbalance. |
|---|---|---|---|---|---|
| lpk | >lpkmx↑st | >lpkmxer | >lpkmx↑ot | >lpkmx↑ot | >>lpkmxit |

TABLE 4-continued

| | | | | | |
|---|---|---|---|---|---|
| lav | >lavmx↑st | >lavmxer | >lavmx↑ot | >lavmx↑ot | >>lavmxit |
| f | nrf | nrf | nrf | nrf | er |
| Vpk | <Vpkmnit | >Vpkmxer | >Vpkmx | >Vpkmx | >Vpkmx |
| Ipk/lav | <2. | er | <2. | <2. | |

| CONFIRM 1 | Based upon changes in value and with time of machine or train conventional instruments |
|---|---|

| | | | | | |
|---|---|---|---|---|---|
| Brg. Vibr. | ↑st | | | | |
| Brg. Temp. | ↑st | | | | |
| Arm. Temp. | | | ↑ot | ↑st | |
| Oil Particles | ↑st | | | | |
| Audible | | ↑ot | | | ↑ot |
| Ham I | | ↑iter | ↑ot | ↑ot | ↑ot |
| Ham V | | | ↑ot | | |
| Fld grnd fault | | | | | |

| CONFIRM #2 | VCM voltage readings with shaft grounding disconnected. Current flow in brgs, etc.? |
|---|---|

| | | | | | |
|---|---|---|---|---|---|
| Vpk | >Vpkmn | >Vpkmxer | >Vpkmx | >Vpkmx | >Vpkmx |
| Vav | >Vavmn | >Vavmxer | >Vavmx | >Vlavmx | >Vavmx |
| Vf | nrf | nrf | nrf | nrf | er |
| Visual and Tests | Look for shorted insulation; measure insulation resistance with ohmmeter following procedure in IEEE #113 | **Inspect lamination edges with a 60× microscope. Perform core "loop test" and possibly el-cid test | **Inspect coils for signs of over heating. Measure phase, coil group resistances, progressively to isolate. | **Megger, high-pot test armature phases then coil groups and coils to isolate fault | Operating examination and fast fourier analysis on the power system voltages and line currents |
| Causes | Foreign object, bad design or assembly | Foreign object; loose, light or overheated core. | Short circuit between coil Adjacent turns or conductors. | Coil fault near neutral or start of a large fault to ground. | Unbalance or harmonics of the electrical power system |

| ITEM | F Uneven Air gap or field pole misalignment. | H Short circuiting of field excitation winding turns | I Field excitation winding ground fault | | J voltage transients from armature or excitationr supply. |
|---|---|---|---|---|---|
| Ipk | >Ipkmx | >Ipkmx↑er | >>Ipkmxit | | >Ipkmx |
| lav | >lavmx | >lavmax↑er | >>lavmsit | | <lavmn |
| f | nrf | nrf | nrf | | nef |
| Vpk | >Vpkmx | >Vpkmx↑er | >>Vpkmxit | | >Vpkmx |
| Ipk/lav | | <2. | | | >>2. |

| CONFIRM 1 | Based upon changes in value and with time of machine or train conventional instruments |
|---|---|

| | | | | |
|---|---|---|---|---|
| Brg. Vibr. | ↑ot | ↑ot | | |
| Brg. Temp. | | | | |
| Arm. Temp. | | | | |
| Oil Particles | | | | |
| Audible | | | | |
| Ham I | | | | |
| Ham V | | | | |
| Fld grnd fault | | | ↑it | |

| CONFIRM #2 | VCM voltage readings with shaft grounding disconnected. Current flow in brgs, etc.? |
|---|---|

| | | | | |
|---|---|---|---|---|
| Vpk | >Vpkmx | >Vpkmx | >Vpkmx | >>Vpkmx |
| Vav | >Vavmx | >Vavmx | >Vavmx | <Vavmn |
| Vf | nrf | nrf | nrf | nef |
| Visual and Tests | **Look for possible weld cracks, core or segment shifts. Measure air gap fully around the bore, both ends. | High field current at load. Low rotor winding AC impedance turn test **AC pole drop test. Dismantle rotor | *Low megger. Visual check collector, field leads. **To locate fault. May require removal and dismantle rotor | Oscilloscope trace of shaft voltage and current confirm excitation supply as the source. |
| Causes | Misalign rotor in stator, broken welds, no dowels | Rotor coil turn distortion due to centrifugal forces and thermal distortion | Weakness or breakdown of excitation winding, leads to ground | Excitation system transients with no suppression |

TABLE 5

Ipk is current peaks in the grounding brushes
lav is average current in the grounding brushes
Vpk is voltage peak of the voltage sensing brushes
Vav is voltage average of the voltage sensing brushes
mn is preset minimum value
mx is preset maximum value

TABLE 5-continued nx represents "n" times the previous value or expected value
H represents higher than typical
f is Waveform Frequency
ef is electrical power frequency
rf is rotor frequency
sbf is current side band frequency

TABLE 5-continued

Inef is electrical power frequency plus harmonics
ef + 3h is electrical power frequency plus its third harmonic
nrf is rotor frequency plus harmonics
ot represents over time
st represents in short time
it represents instantaneous
er represents erratic or pulsing behavior
EM is Electromagnetic pick-up signal on the operating unit, usually at the casing or bearing parting line.
< represents less than and << represents much less than
> represents more than and >> represents much more than
↑ represents increasing in value and
↓ represents decreasing in value An analysis routine based on the warning criteria in Tables 1, 2, 3 and 4 is set to detect and indicate the earliest occurrence of possible machine and/or train problems. Problem development indications are most reliable when initial benchmark settings of measured variables are set for machines which are new or in good operating condition.

Numerous modifications and alternative embodiments of the invention will be apparent to those skilled in the art in view of the foregoing description. The signal conditioning and analysis circuitry can be implemented on a dedicated integrated circuit. The dedicated integrated circuit can be a specialized analog device, a digital device, or a hybrid analog/digital device. Reduction of the conditioning and analysis circuits can enable the present invention, shaft voltage current monitoring system for early warning and problem detection, to be integrated into rotating machinery. The alarm/warning indicator may be integral and/or remote. Accordingly, this description is to be construed as illustrative only and is for the purpose of teaching those skilled in the art the best mode of carrying out the invention. Details of the structure may be varied substantially without departing from the spirit of the invention and the exclusive use of all modifications, which come within the scope of the appended claim, is reserved.

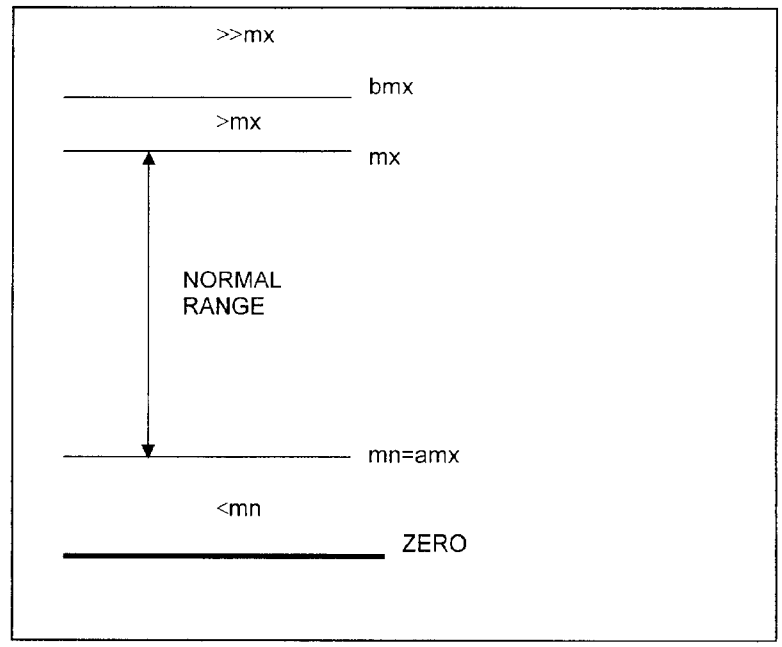

I claim:

1. A rotating machinery monitor comprising:
    at least one current sensor for detecting shaft grounding current in the rotating machinery;
    at least one voltage sensor for detecting shaft voltage in the rotating machinery;
    a change detector for determining rate of change in the shaft grounding current and a rate of change in the shaft voltage;
    a sampling device for data reduction wherein real-time shaft current values and real-time shaft voltage values are compressed over time;
    an evaluation system for producing a warning as a function of the change in the shaft grounding current, the rate of change in the shaft voltage and the average shaft grounding current;
    wherein the warning is indicative of a developing problem with the rotating machinery.

2. The rotating machine monitor as recited in claim 1 wherein the change detector determines a first order derivative of the shaft voltage and a first order derivative of the shaft grounding current.

3. The rotating machine monitor as recited in claim 1 wherein the warning is further a function of waveform frequency.

4. The rotating machine monitor as recited in claim 1 wherein the warning is further a function of rotor frequency.

5. A method for monitoring rotating machinery comprising the steps of:
    detecting shaft grounding current in the rotating machinery;
    detecting shaft voltage in the rotating machinery;
    determining rate of change in the shaft grounding current;
    determining rate of change in the shaft voltage;
    sampling real-time shaft current values and real-time shaft voltage values over time;
    producing a warning as a function of the change in the shaft grounding current, the rate of change in the shaft voltage and the shaft grounding current, wherein the warning is indicative of a developing problem with the rotating machinery.

6. The method as recited in claim 5 wherein the step of determining rate of change in the shaft grounding current determines a first order derivative of the shaft grounding current.

7. The method as recited in claim 5 wherein the step of determining rate of change in the shaft voltage determines a first order derivative of the shaft voltage.

8. The method as recited in claim 5 wherein the warning is further a function of waveform frequency.

9. The method as recited in claim 5 wherein the warning is further a function of rotor frequency.

10. An electric motor with integral shaft current and voltage monitor comprising:
    an electric motor;
    a current sensor for detecting shaft grounding current in the electric motor;
    a voltage sensor for detecting shaft voltage in the electric motor;
    a change detector for determining rate of change in the shaft grounding current and a rate of change in the shaft voltage;
    a sampling device for data reduction wherein real-time shaft current values and real-time shaft voltage values are compressed over time;
    an evaluation circuit for producing a warning as a function of the change in the shaft grounding current, the rate of change in the shaft voltage and the shaft grounding current;
    wherein the warning is indicative of a developing problem with the electric motor.

11. The electric motor with integral shaft current and voltage monitor as recited in claim 10 wherein the change detector determines a first order derivative of the shaft voltage and a first order derivative of the shaft grounding current.

12. The electric motor with integral shaft current and voltage monitor as recited in claim 10 wherein the warning is further a function of waveform frequency.

13. The electric motor with integral shaft current and voltage monitor as voltage monitor as recited in claim 10 wherein the warning is further a function of rotor frequency.

14. A rotating machine monitor comprising:
    at least one current sensor for detecting shaft grounding current in the rotating machinery;
    at least one voltage sensor for detecting shaft voltage in the rotating machinery;
    a change detector for determining rate of change in the shaft grounding current and a rate of change in the shaft voltage;
    an evaluation system for producing a warning as a function of the change in the shaft grounding current, the rate of change in the shaft voltage and the average shaft grounding current;

wherein the warning is indicative of a developing problem with the rotating machinery and the warning is further a function of the ratio of peak grounding current to average grounding current.

15. A method for monitoring rotating machinery comprising the steps of:

detecting shaft grounding current in the rotating machinery;

detecting shaft voltage in the rotating machinery;

determining rate of change in the shaft grounding current;

determining rate of change in the shaft voltage;

producing a warning as a function of the change in the shaft grounding current, the rate of change in the shaft voltage and the shaft grounding current, wherein the warning is indicative of a developing problem with the rotating machinery and is further a function of the ratio of peak grounding current to average grounding current.

16. An electric motor with integral shaft current and voltage monitor comprising:

an electric motor;

a current sensor for detecting shaft grounding current in the electric motor;

a voltage sensor for detecting shaft voltage in the electric motor;

a change detector for determining rate of change in the shaft grounding current and a rate of change in the shaft voltage;

an evaluation circuit for producing a warning as a function of the change in the shaft grounding current, the rate of change in the shaft voltage and the shaft grounding current;

wherein the warning is indicative of a developing problem with the electric motor and is further a function of the ratio of peak grounding current to average grounding current.

* * * * *

UNITED STATES PATENT AND TRADEMARK OFFICE
CERTIFICATE OF CORRECTION

PATENT NO.    : 6,460,013 B1
DATED         : October 1, 2002
INVENTOR(S)   : Paul I. Nippes It is certified that error appears in the above-identified patent and that said Letters Patent is hereby corrected as shown below:

Column 2,
Line 16, please replace "voltage/current" with -- voltage and/or current --.

Columns 7-15,
Please replace Table 1 through 5 with correctly formatted Tables 1 through 5.

Signed and Sealed this

Ninth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,460,013 B1
DATED          : October 1, 2002
INVENTOR(S)    : Paul I. Nippes It is certified that error appears in the above-identified patent and that said Letters Patent is hereby corrected as shown below:

Column 2,
Line 16, please replace "voltage/current" with -- voltage and/or current --.

Columns 7-15,
Please replace Tables 1 through 5 with correctly formatted Tables 1 through 5.

This certificate supersedes Certificate of Correction issued September 9, 2003.

Signed and Sealed this

Fourth Day of November, 2003

JAMES E. ROGAN
*Director of the United States Patent and Trademark Office*

TABLE #1 - VCM-E WARNINGS OF PROBLEM DEVELOPMENT IN ALL ELECTRICALLY-ISOLATED ROTATING MACHINERY SHAFTS

| ITEM | 1. Shaft Grounding Maintenance | 2. High Electrostatic Charge on Shaft | 3. High Residual Magnetism | 4. High Localized Internal Residual Magnetism | 5. Shaft element Contact to Stationary element (Bearing, Seal) |
|---|---|---|---|---|---|
| Ipk | <<Ipkmn | >Ipkmx | >Ipkmx | <Ipkmn | >>Ipkmx↑it |
| Iav | <<Iavmn | | | <Iavmn | >>Iavmx↑it |
| If | er | er | nrf | | nrf |
| Vpk | ↑it | | <Vpkmx | <Vpkmn | ↓it |
| Ipk/Iav | | >2. | <2. | . | <2. |
| EM/f | | ?/er | ↑/nrf | ↑/nrf | ↑/rf |

| CONFIRM 1 | Based upon changes in value and with time of machine or train conventional instruments | | | | |
|---|---|---|---|---|---|
| Brg. Vibr. | | ↑ot | ↑ot | ↑ot | ↑st |
| Brg. Temp. | | ↑ot | ↑ot | ↑ot | ↑st |
| Oil Particles. | | | ↑ot | ↑ot | |
| Audible | | | ↑ot | ↑ot | ↑st |
| Shaft displacement | | ↑ot | ↑ot | ↑ot | |

| CONFIRM #2; Ipk=0 | VCM voltage readings with shaft grounding disconnected. <u>Current flow in brgs, etc.?</u> | | | | |
|---|---|---|---|---|---|
| Vpk | <Vpkmn | >>Vpkmx | >Vpkmx | <Vpkmn | >Vpkmx |
| Vav | <Vavmn | <Vavmx. | >Vavmx | <Vavmn | >Vavmx |
| Vf | | er | nrf | | nrf |
| Vpk/Av | | >2. | | | |
| Visual & Test | Inspect and ohmeter test brush, cables & grounding circuit | Frosting on Bearings, seals | Heavy frosting, spark tracks at bearings. Shaft drops and/or moves axially | Dismantle and make magnetic survey of internal components | Rub t of rotating to stationary parts. Thermal distortion, discoloration |
| Causes | a. There is no stray voltage source.<br>b. Brush contact to the shaft is lost.<br>c. Brush grounding circuit is open. | a. Wet Steam.<br>b. Dry steam.<br>c. High oil velocity.<br>d. Oil filter. | a. Magnetized components, rotor or stator.<br>b. Improper welding practices.<br>c. Electric currents.<br>d. Magnetic Particle inspection.<br>e. Lightning. | a. Magnetism inside unit, not measurable either as magnetism or generated voltage external to the unit.<br>b. Usually a rub, installed magnetized part, welding, MPI etc. | a. Looseness, movement.<br>b. Imbalance.<br>c. Foreign objects.<br>d. Mechanical distortion. |

TABLE #2 - SPECIFIC TO INDUCTION MOTORS AND INDUCTION GENERATORS

| ITEM | A Shorted insulation on bearing, seal or coupling. | B Shorted stator or rotor core laminations. | C Armature winding turn or transposition fault. | D Low level armature winding fault to ground. | E Electrical system has phase unbalance or harmonics. | F Uneven Air gap or stator segment misalignment | G Induction motor bar or end ring breakage or discontinuity. |
|---|---|---|---|---|---|---|---|
| Ipk | >>Ipkmx↑st | >Ipkmxer | >Ipkmx↑ot | >Ipkmx↑ot | >Ipkmx | >Ipkmx | >Ipkmx |
| Iav | >>Iavmx↑st | >Iavmxer | >Iavmx↑ot | >Iavmx↑ot | >Iavmx | >Iavmx | >Iavmx |
| f | ef | nef | nef | ef+3h | nef | nrf | nrf |
| Vpk | <Vpkmnit | >Vpkmxster | >Vpkmx | >Vpkmx | >Vpkmx | >Vpkmx | >Vpkmx |
| Ipk/Iav | <2. | <2. | <2. | <2. | <2. | | |

| CONFIRM 1 | Based upon changes in value and with time of machine or train conventional instruments | | | | | | |
|---|---|---|---|---|---|---|---|
| Brg. Vibr. | ↑st | | | | | ↑ot | ↑st |
| Brg. Temp. | ↑st | | | | | | |
| Arm. Temp. | | ↑ot | ↑st | | | | |
| OilParticles | ↑st | | | | | | |
| Audible | | ↑ot | | | ↑ot | | ↑ot |
| Core Vibr. | | ↑ot | | | ↑ot | ↑ot | |
| Harm Iph | | ↑iter | ↑ot | ↑ot | ↑ot | | ↑ot+sbf |
| Harm Vph | | | ↑ot | | | | |
| Par. Disch. | | ↑it | ↑it | ↑ot | | | |
| Gas Monitor | | ↑ster | ↑ot | ↑ot | | | |

| CONFIRM #2 | Based on VCM voltage readings when grounding brush(es) are disconnected momentarily | | | | | | |
|---|---|---|---|---|---|---|---|
| Vpk | >Vpkmn | >Vpkmxer | >Vpkmx | >Vpkmx | >Vpkmx | >Vpkmx | >Vpkmx |
| Vav | >Vavmn | >Vavmxer | >Vavmx | >Vavmx | >Vavmx | >Vavmx | >Vavmx |
| Vf | ef | nef | nef | ef+3h | nef | nrf | nrf |
| Visual and Tests | Look for shorted insulation; measure insulation resistance with ohmmeter following procedure in IEEE #112 | ** Inspect lamination edges with a 60x microscope. Perform core "loop test" and possibly el-cid test | ** Inspect coils for signs of over heating. Measure phase, coil group resistances, progressively to isolate. | ** Megger, high-pot test armature phases then coil groups and coils to isolate fault | Operating examination and fast fourier analysis on the power system voltages and line currents | ** Look for possible weld cracks, core or segment shifts. Measure air gap fully around the bore, both ends. | ** Confirm side band test results by careful rotor cage inspection, broken bar test and x-ray examinations. |
| Causes | Foreign object, bad design or assembly | Foreign object, loose, tight, or overheated core. | Short circuit between coil Adjacent turns or conductors. | Coil fault near neutral or start of a large fault to ground. | Unbalance or harmonics of the electrical power system | Misalign rotor in stator, broken welds, no dowels | Inertia, load too high for starting inertia or poor braze |

TABLE #3 - SPECIFIC TO SYNCHRONOUS MOTORS AND GENERATORS

| ITEM | A Shorted insulation on bearing, seal or coupling. | B Shorted stator core laminations. | C Armature winding turn or transposition fault. | D Low level armature winding fault to ground. | E Electrical system has phase unbalance or harmonics. | F Uneven Air gap or stator segment misalignment | H Short circuiting of field excitation winding turns | I Field excitation winding ground fault | J voltage or current transients from excitation current. |
|---|---|---|---|---|---|---|---|---|---|
| Ipk | >Ipkmx↑st | >Ipkmxer | >Ipkmx↑ot | >Ipkmx↑ot | >Ipkmx | >Ipkmx | >Ipkmx↑er | >>Ipkmxit | >>Ipkmx |
| Iav | >Iavmx↑st | >Iavmxer | >Iavmx↑ot | >Iavmx↑ot | >Iavmx | >Iavmx | >Iavmx↑er | >>Iavmxit | <Iavmn |
| f | ef | nef | nef | ef+3h | nef | nrf | nxrf | nef | nef |
| Vpk | <Vpkmnit | >Vpkmxer | >Vpkmx | >Vpkmx | >Vpkmx | >Vpkmx | >Vpkmx↑er | >>Vpkmxit | >Vpkmx |
| Ipk/Iav | <2. | er | <2. | <2. | | | <2. | | >2. |

| CONFIRM 1 | Based upon changes in value and with time of machine or train conventional instruments |||||||||
|---|---|---|---|---|---|---|---|---|---|
| Brg. Vibr. | ↑st | | | | | ↑ot | ↑ot | | |
| Brg. Temp. | ↑st | | | | | | | | |
| Arm. Temp. | | ↑ot | ↑st | | | | | | |
| OilParticles | ↑st | | | | | | | | |
| Audible | | ↑ot | | ↑ot | | | | | |
| Core Vibr. | | ↑ot | | | ↑ot | ↑ot | | | |
| Harm Iph | | ↑iter | ↑ot | ↑ot | ↑ot | | | | |
| Harm Vph | | | ↑ot | | | | | | |
| Par. Disch. | | ↑it | ↑it | ↑ot | | | | | |
| Gas Monitor | | ↑ster | ↑ot | ↑ot | | | | | |
| Fld grnd fault | | | | | | | | ↑it | |
| CONFIRM #2 | VCM voltage readings with shaft grounding disconnected. <u>Current flow in brgs, etc.?</u> |||||||||
| Vpk | >Vpkmn | >Vpkmxer | >Vpkmx | >Vpkmx | >Vpkmx | >Vpkmx | >Vpkmx | >Vpkmx | >>Vpkmx |
| Vav | >Vavmn | >Vavmxer | >Vavmx | >Vavmx | >Vavmx | >Vavmx | >Vavmx | >Vavmx | <Vavmn |
| Vf | ef | nef | nef | Nef+3h | nef | nrf | nrf | | 6xer |
| Visual and Tests | Look for shorted insulation; measure insulation resistance with ohmmeter following IEEE #1112 | ** Inspect lamination edges with a 60x microscope. Perform core "loop test" and possibly el-cid test | ** Inspect coils for signs of over heating. Measure phase, coil group resistances, progressively to isolate. | ** Megger, high-pot test armature phases then coil groups and coils to isolate fault | Operating examination and fast fourier analysis on the power system voltages and line currents | ** Look for possible weld cracks, core or segment shifts. Measure air gap fully around the bore, both ends | High field current at load. Low rotor winding AC impedance turn test ** AC pole drop test. Dismantle rotor. | *Low megger, Visual check collector, field leads. ** May require removal & dismantle rotor to locate | Oscilloscope trace of shaft voltage and current confirm excitation supply as the source. |
| Causes | Foreign object, bad design or assembly | Foreign object, loose, tight, or overheated core. | Short circuit between coil, adjacent turns or conductors. | Coil fault near neutral or start of a large fault to ground. | Unbalance or harmonics of the electrical power sys. | Misalign rotor in stator, broken welds, no dowels | Rotor coil turn distortion due to centrifugal forces and thermal distortion | Weakness or break-down of excitation winding, leads to gnd. | Excitation system transients with no suppression |

TABLE #4 - SPECIFIC TO DIRECT CURRENT MOTORS AND GENERATORS

| ITEM | A Shorted insulation on bearing, seal or coupling. | B Shorted armature core laminations. | C Armature winding turn fault. | D Low level armature winding fault to ground. | E Commutator or brush problems causing circuit unbalance. | F Uneven Air gap or field pole misalignment. | H Short circuiting of field excitation winding turns | I Field excitation winding ground fault | J voltage transients from armature or excitationr supply. |
|---|---|---|---|---|---|---|---|---|---|
| Ipk | >Ipkmx↑st | >Ipkmxer | >Ipkmx↑ot | >Ipkmx↑ot | >>Ipkmxit | >Ipkmx | >Ipkmx↑er | >>Ipkmxit | >>Ipkmx |
| Iav | >Iavmx↑st | >Iavmxer | >Iavmx↑ot | >Iavmx↑ot | >>Iavmxit | >Iavmx | >Iavmx↑er | >>Iavmxit | <Iavmn |
| f | nrf | nrf | nrf | nrf | er | nrf | nrf | nrf | nef |
| Vpk | <Vpkmnit | >Vpkmxer | >Vpkmx | >Vpkmx | >Vpkmx | >Vpkmx | >Vpkmx↑er | >>Vpkmxit | >Vpkmx |
| Ipk/Iav | <2. | er | <2. | <2. | | | <2. | | >>2. |

| CONFIRM 1 | Based upon changes in value and with time of machine or train conventional instruments ||||||||| 
|---|---|---|---|---|---|---|---|---|---|
| Brg. Vibr. | ↑st | | | | | ↑ot | ↑ot | | |
| Brg. Temp. | ↑st | | | | | | | | |
| Arm. Temp. | | ↑ot | ↑st | | | | | | |
| OilParticles | ↑st | | | | | | | | |
| Audible | | ↑ot | | | ↑ot | | | | |
| Harm I | | ↑iter | ↑ot | ↑ot | ↑ot | | | | |
| Harm V | | | ↑ot | | | | | | |
| Fld grnd fault | | | | | | | | ↑it | |
| CONFIRM #2 | VCM voltage readings with shaft grounding disconnected. Current flow in brgs, etc.? ||||||||| 
| Vpk | >Vpkmn | >Vpkmxer | >Vpkmx | >Vpkmx | >Vpkmx | >Vpkmx | >Vpkmx | >Vpkmx | >>Vpkmx |
| Vav | >Vavmn | >Vavmxer | >Vavmx | >Vlavmx | >Vavmx | >Vavmx | >Vavmx | >Vavmx | <Vavmn |
| Vf | nrf | nrf | nrf | nrf | er | nrf | nrf | nrf | nef |
| Visual and Tests | Look for shorted insulation; measure insulation resistance with ohmmeter following procedure in IEEE #113 | ** Inspect lamination edges with a 60x microscope. Perform core "loop test" and possibly el-cid test | ** Inspect coils for signs of over heating. Measure phase, coil group resistances, progressively to isolate. | ** Megger, high-pot test armature phases then coil groups and coils to isolate fault | Operating examination and fast fourier analysis on the power system voltages and line currents | ** Look for possible weld cracks, core or segment shifts. Measure air gap fully around the bore, both ends. | High field current at load. Low rotor winding AC impedance turn test ** AC pole drop test. Dismantle rotor | *Low megger, Visual check collector, field leads. **To locate fault . May require removal and dismantle rotor | Oscilloscope trace of shaft voltage and current confirm excitation supply as the source. |
| Causes | Foreign object, bad design or assembly | Foreign object; loose, tight, or overheated core. | Short circuit between coil Adjacent turns or conductors. | Coil fault near neutral or start of a large fault. to ground. | Unbalance or harmonics of the electrical power system | Misalign rotor in stator, broken welds, no dowels | Rotor coil turn distortion due to centrifugal forces and thermal distortion | Weakness or breakdown of excitation winding, leads to ground | Excitation system transients with no suppression |

TABLE #5 - LEGEND AND NOTES CORRESPONDING TO TABLES 1 THROUGH 4

Ipk, Iav = Current peaks and averages of current in grounding brushes
Vpk, Vav = Voltage peaks and averages of voltage sensing brushes.
mn = preset minimum value; mx = preset maximum value. Applies to Ipk, Iav, Vpk. Vav
< = Less than;  << = Much less than;  > = greater than; >> = much greater than.
↑ = increasing in value;  ↓ = decreasing in value.
+ = added to normal values.
nx = "n" times the previous, or expected, value.
H = higher than typical.
f = Waveform Frequency;  ef = electric power frequency;  rf = rotor frequency,  sbf = current side band frequency.
Inef = electric power frequency plus harmonics;  ef+3h = electric power frequency plus its third harmonic.
nrf = rotor frequency plus harmonics.
ot = over time;  st = in short time;  it = instantaneous,  er = erratic or pulsing behavior;.
EM = Electromagnetic pick-up signal on the operating unit, usually at the casing or bearing parting line.

General description of the intent of the limiting variables: